United States Patent
Yamamoto (10) Patent No.: US 8,277,597 B2
(45) Date of Patent: Oct. 2, 2012

(54) METHOD FOR BONDING HIGH HEAT CONDUCTIVE INSULATING RESIN

(75) Inventor: Ren Yamamoto, Aichi-gun (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/075,451

(22) Filed: Mar. 30, 2011

(65) Prior Publication Data
US 2011/0174428 A1 Jul. 21, 2011

Related U.S. Application Data

(63) Continuation of application No. PCT/JP2009/059338, filed on May 21, 2009.

(51) Int. Cl.
*B29C 65/00* (2006.01)

(52) U.S. Cl. ......... 156/286; 156/285; 438/118; 438/122

(58) Field of Classification Search ............ 156/285, 156/286, 381, 382; 438/122, 118
See application file for complete search history.

(56) References Cited

U.S. PATENT DOCUMENTS

| | | | | |
|---|---|---|---|---|
| 6,048,656 A | * | 4/2000 | Akram et al. | 438/118 |
| 6,130,113 A | * | 10/2000 | Eslamy et al. | 156/382 |

FOREIGN PATENT DOCUMENTS

| | | | |
|---|---|---|---|
| JP | 2004-048084 A | | 2/2004 |
| JP | 2004-087735 | * | 3/2004 |
| JP | 2004-087735 A | | 3/2004 |
| JP | 2006-253277 A | | 9/2006 |
| JP | 2007-173338 A | | 7/2007 |
| JP | 2008-166680 A | | 7/2008 |

\* cited by examiner

*Primary Examiner* — Khanh P Nguyen
*Assistant Examiner* — John Blades
(74) *Attorney, Agent, or Firm* — Kenyon & Kenyon LLP (57) ABSTRACT

Provided is a method for bonding a high heat conductive insulating resin, by which the high heat conductive insulating resin can be bonded to a heat sink without deteriorating insulating characteristics and heat conducting characteristics. The method includes: a fixing step of fixing the heat sink by means of a jig having a vacuuming function; a placing step of placing the heat sink fixed with the jig on a sheet-like high heat conductive insulating resin previously bonded to a cooler and making a hermetically closed space; and a bonding step of having a bonding section between the heat sink and the sheet-like high heat conductive insulating resin under a negative pressure by depressurizing the hermetically closed space, heating the sheet-like high heat conductive insulating resin, and bonding the sheet-like high heat conductive insulating resin to the heat sink.

2 Claims, 8 Drawing Sheets

METHOD FOR BONDING HIGH HEAT CONDUCTIVE INSULATING RESIN

CROSS-REFERENCE TO RELATED APPLICATIONS

This application is a continuation application based upon and claims the benefit of the prior PCT International Patent Application No. PCT/JP2009/059338 filed on May 21, 2009, the entire contents of which are incorporated herein by reference.

TECHNICAL FIELD

The present invention relates to a method for bonding high heat conductive insulating resin to a heat sink provided in a power module.

BACKGROUND ART

Heretofore, a power semiconductor module (a power module) for large current such as IGBT (Insulated Gate Bipolar Transistor), a power MOS-FET, and a power transistor is known as a switching device. Such power module is installed in a hybrid vehicle, an electric vehicle, and others. Since a semiconductor element generates a large amount of self heating during operation, the in-vehicle power module needs to include a cooling structure having a high heat dissipation performance.

Figure 13:
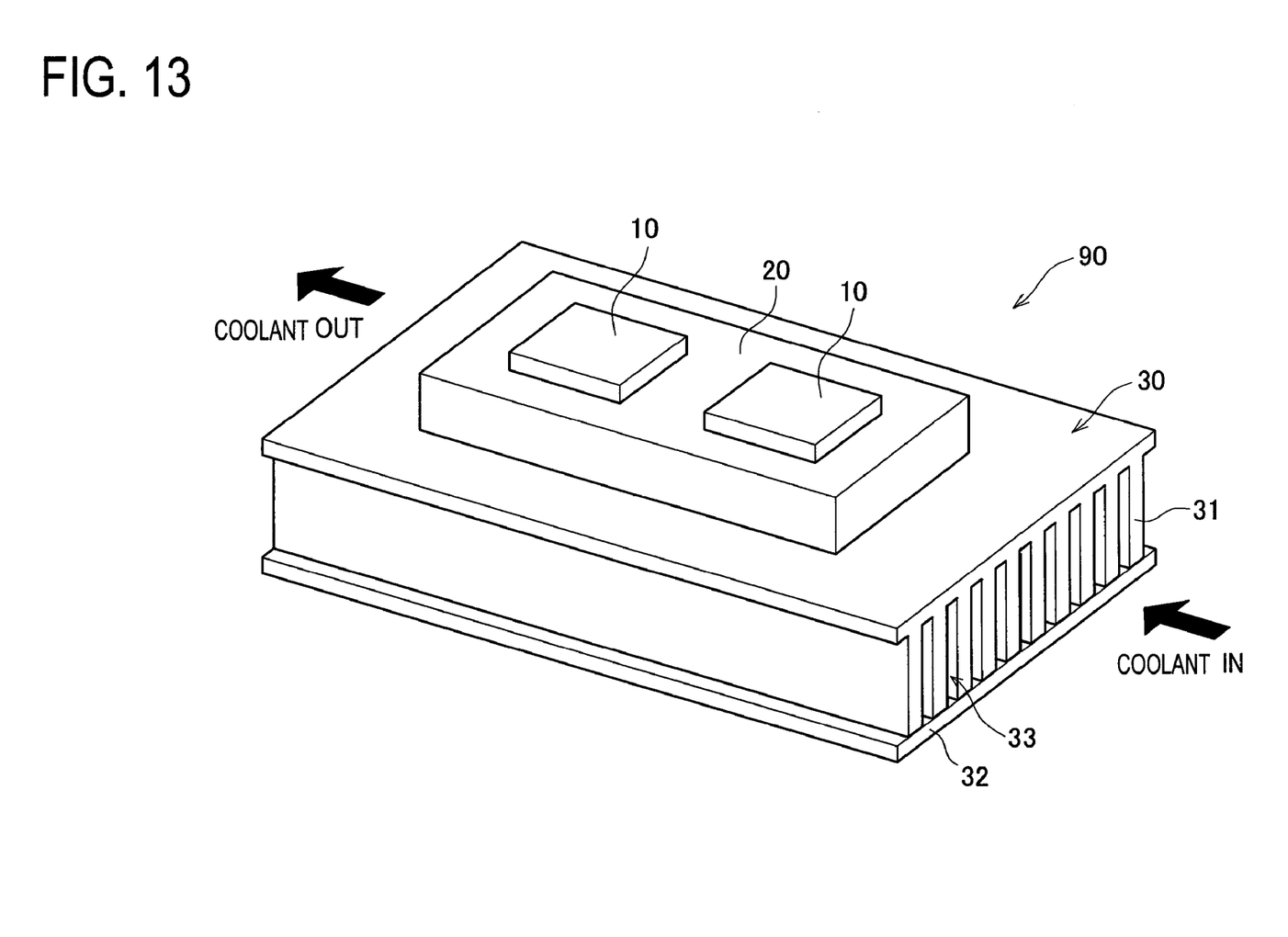
FIG. 13 is a schematic perspective view a conventional power module.

FIG. 13 shows one example of the power module including a cooler. A power module 90 includes a plurality of semiconductor elements 10 which are heating elements, a heat sink 20 to which the semiconductor elements 10 are soldered, and a cooler 30 including flow channels 33 formed by cooling fins 31 and a cover plate 32. With this structure, the heat generated in each semiconductor element 10 is transferred to the entire heat sink 20. The transferred heat is exchanged by a coolant flowing in the cooler 30, thereby effectively cooling each semiconductor element 10.

The heat sink 20 and the cooler 30 need to be electrically insulated from each other. Thus, both are bonded to each other through insulating resin. It is further necessary to prevent deterioration of the heat transfer coefficient between the heat sink 20 and the cooler 30. Accordingly, the insulating resin used therein is high heat conductive resin that exhibits good heat conductivity.

Herein, in the case of using the high heat conductive insulating resin in the form of a sheet, this sheet is bonded to the cooler 30 in advance, and the heat sink 20 is pressed (pressurized) against the sheet while the sheet is being heated, thereby bonding the sheet to the heat sink 20.

Alternatively, in the case of using the high heat conductive insulating resin in the form of a liquid, it is conceivable to bond the high heat conductive insulating resin to the heat sink 20 by injecting and sealing the liquid resin into a predetermined region (between the heat sink 20 and the cooler 30) through an injection path, thus bonding the high heat conductive insulating resin to the heat sink 20.

CITATION LIST

Patent Literature

Patent Literature 1: JP 2004-048084A

SUMMARY OF INVENTION

Technical Problem

In the aforementioned conventional bonding method, however, there is a possibility that an insulating performance or a heat conducting performance may be deteriorated. In the former bonding method, specifically, the heat sink 20 with the semiconductor elements 10 soldered thereto is pressurized. This pressurizing has to be performed so as to keep out of the semiconductor elements 10. It is therefore very difficult to uniformly pressurize the heat sink 20 against the sheet. Further, each component may have warp, slope, uneven surface roughness, etc and thus stress is locally concentrated on the sheet during pressurizing of the heat sink 20. This may break the resin sheet. When the resin sheet is broken, the insulating performance could not be ensured and also the heat conducting performance could remarkably deteriorate.

It is also conceivable that the resin sheet is bonded to the heat sink 20 before the semiconductor elements 10 are soldered onto the heat sink 20. In this case, the semiconductor elements 10 are soldered onto the heat sink 20 after the resin sheet is bonded. At the time of soldering, the temperature of the heat sink 20 is apt to rise to 300° C. or more, which is higher than the heat resistant temperature (about 200° C.) of the high heat conductive insulating resin. Consequently, such a bonding method could not be adopted.

On the other hand, the latter bonding method could prevent breakage of the high heat conductive insulating resin. However, when the liquid resin is injected and sealed in the predetermined region, the resin is liable to contain air bubbles, which may generate voids. In case voids occur, the heat conducting performance remarkably deteriorates.

The present invention has been made to solve the above problems and has a purpose to provide a method of bonding high heat conductive insulating resin, capable of bonding the high heat conductive insulating resin to a heat sink without deteriorating the insulating performance and the heat conducting performance of the high heat conductive insulating resin.

Solution to Problem

To achieve the above purpose, one aspect of the invention provides a method of bonding a high heat conductive insulating resin to a heat sink on which a semiconductor element is soldered so that the high heat conductive insulating resin is interposed between a heat sink and a cooler, the heat sink being to be provided in a power module, the method comprising: a fixing step of fixing the heat sink with a jig; a placing step of placing the heat sink fixed with the jig onto a sheet-like high heat conductive insulating resin bonded to the cooler in advance, to create a hermetically closed space; and a bonding step of reducing pressure in the hermetically closed space to create a negative pressure around bonded portions of the heat sink and the sheet-like high heat conductive insulating resin and heating the sheet-like high heat conductive insulating resin to bond the sheet-like high heat conductive insulating resin to the heat sink, wherein the fixing step includes horizontally fixing the heat sink with the jig to hold the heat sink between internal surfaces of the jig, the placing step includes making the jig adsorbs the cooler through an opening formed in an end of the jig to create the hermetically closed space defined by the heat sink, the cooler, and the jig, and the bonding step includes evacuating air from the hermetically closed space through a hole formed in the internal surfaces of the jig to create a negative pressure around the bonded portions.

In this bonding method, the hermetically closed space is created in the placing step and the hermetically closed space is depressurized in the bonding step to create a negative pressure around the bonded portions of the heat sink and the sheet-like high heat conductive insulating resin. Accordingly, owing to a pressure difference, the heat sink and the sheet-like high heat conductive insulating resin can be uniformly bonded in a close contact manner. Further, the heat sink is not pressurized from above (a semiconductor element side). It is therefore possible to prevent stress concentration from occurring on the sheet-like high heat conductive insulating resin during bonding, so that the high heat conductive insulating resin is not broken. This prevents deterioration in the insulating performance of the high heat conductive insulating resin.

Since the heat sink and the resin are bonded under a reduced pressure, voids are less likely to occur in a bonding surface of the resin. Even if voids occur, such voids are smaller than conventional ones. This prevents deterioration in the heat conducting performance of the high heat conductive insulating resin.

According to the above bonding method, it is possible to uniformly bond the high heat conductive insulating resin without breakage during a bonding work, thus preventing the generation of voids. As a result, the high heat conductive insulating resin can be bonded to the heat sink without deteriorating the insulating performance and the heat conducting performance of the high heat conductive insulating resin.

Further, the fixing step includes horizontally fixing the heat sink with the jig to hold the heat sink between internal surfaces of the jig, the placing step includes making the jig adsorbs the cooler through an opening formed in an end of the jig to create the hermetically closed space defined by the heat sink, the cooler, and the jig, and the bonding step includes evacuating air from the hermetically closed space through a hole formed in the internal surfaces of the jig to create a negative pressure around the bonded portions.

With the above configuration, it is possible to easily create the hermetically closed space for reducing pressure by simply preparing an additional jig having the aforementioned vacuuming function. Since the hermetically closed space is created by use of the heat sink and the cooler, the hermetically closed space can be made small. Accordingly, an equipment for bonding the high heat conductive insulating resin to the heat sink can be reduced in size and simplified.

In the aforementioned bonding method of high heat conductive insulating resin, preferably, a surface of the heat sink to be bonded to the resin is formed with a taper in a peripheral edge portion.

As above, the surface of the heat sink to be bonded to the resin has a taper in the peripheral edge portion. This can reliably create the hermetically closed space by combination of the heat sink, the cooler, and the jig, thereby surely reducing pressure in the hermetically closed space by use of the jig.

The aforementioned bonding method of high heat conductive insulating resin may be arranged such that the heat sink is formed with a through hole in a portion near the center of the heat sink, in which portion no semiconductor element is soldered, the sheet-like high heat conductive insulating resin is bonded in separate form to the cooler so that the sheet-like high heat conductive insulating resin is not placed near the position of the through hole, the fixing step includes horizontally fixing the heat sink with the jig to hold the heat sink between internal surfaces of the jig, the placing step includes making the jig adsorbs the cooler through an opening formed in an end of the jig to create the hermetically closed space defined by the heat sink, the cooler, and the jig, and the bonding step includes evacuating air from the hermetically closed space through the through hole by an adsorbing jig for adsorbing to the heat sink by covering over the through hole, creating a negative pressure around the bonded portions.

Accordingly, air is evacuated from the hermetically closed space through near the center thereof by use of the adsorbing jig. This can bring the heat sink and the sheet-like high heat conductive insulating resin into more uniformly contact relation. Since the sheet-like high heat conductive insulating resin is divided, the contact strength of the heat sink and the high heat conductive insulating resin can be enhanced. It is therefore possible to uniformly bond the high heat conductive insulating resin without breakage and also prevent the generation of voids.

A second aspect of the invention to solve the aforementioned problems provides a method of bonding a high heat conductive insulating resin to a heat sink on which a semiconductor element is soldered so that the high heat conductive insulating resin is interposed between a heat sink and a cooler, the heat sink being to be provided in a power module, the method comprising: a fixing step of fixing the heat sink with a jig to hold the heat sink between internal surfaces of the jig; a placing step of making the jig fixing the heat sink adsorb the cooler through an opening formed in an end of the jig to create a hermetically closed space defined by the heat sink, the cooler, and the jig; and a bonding step of bonding the high heat conductive insulating resin to the heat sink by injecting liquid high heat conductive insulating resin into the hermetically closed space while sucking and extracting the injected high heat conductive insulating resin through a hole formed in internal surfaces of the jig to fill the high heat conductive insulating resin in the hermetically closed space.

In the above bonding method, the hermetically closed space is created by combination of the heat sink, the cooler, and the jig, the liquid high heat conductive insulating resin is injected into the hermetically closed space in the bonding step while sucking and extracting the injected high heat conductive insulating resin through the hole in the internal surfaces of the jig, thereby filling the high heat conductive insulating resin in the hermetically closed space. Accordingly, the liquid high heat conductive insulating resin uniformly flows in the hermetically closed space, avoiding the generation of voids. Thus, the heat conducting performance of the high heat conductive insulating resin will not deteriorate.

In this bonding method, furthermore, the liquid high heat conductive insulating resin is filled in the hermetically closed space to bond the high heat conductive insulating resin to the heat sink. The high heat conductive insulating resin is less damaged. Thus, the insulating performance of the high heat conductive insulating resin will not decrease.

As above, the bonding method of the second aspect of the invention can also uniformly bond the high heat conductive insulating resin without breakage and also prevent the generation of voids during bonding. As a result, it is possible to bond the high heat conductive insulating resin to the heat sink without deteriorating the insulating performance and the heat conducting performance of the high heat conductive insulating resin. According to this bonding method, furthermore, at the time when the high heat conductive insulating resin is bonded to the heat sink, the resin is also bonded to the cooler. Therefore, different from the aforementioned method, the high heat conductive insulating resin does not need to be bonded to the cooler in advance.

In the bonding method of high heat conductive insulating resin in the second aspect of the present invention, preferably, the heat sink is formed with a through hole in a portion near the center of the heat sink, in which portion no semiconductor element is soldered, the bonding step includes injecting the liquid high heat conductive insulating resin into the hermetically closed space through the through hole.

Accordingly, it is possible to inject the liquid high heat conductive insulating resin into the hermetically closed space through near the center thereof while sucking and extracting the injected high heat conductive insulating resin from the periphery of the hermetically closed space. This allows the liquid high heat conductive insulating resin to uniformly flow in the hermetically closed space and be filled therein. It is therefore possible to reliably prevent the generation of voids.

Advantageous Effects of Invention

According to the bonding method of the high heat conductive insulating resin in the above aspects of the invention, as mentioned above, the high heat conductive insulating resin can be uniformly brought in close contact with the heat sink without applying uneven pressure to the high heat conductive insulating resin. It is therefore possible to bond the high heat conductive insulating resin to the heat sink without deteriorating the insulating performance and the heat conducting performance.

DESCRIPTION OF EMBODIMENTS

A detailed description of a preferred embodiment of a bonding method of high heat conductive insulating resin embodying the present invention will now be given referring to the accompanying drawings. The present embodiment explains about an example using the bonding method of the invention to manufacture an in-vehicle intelligent power module.

First Embodiment

Figure 1:
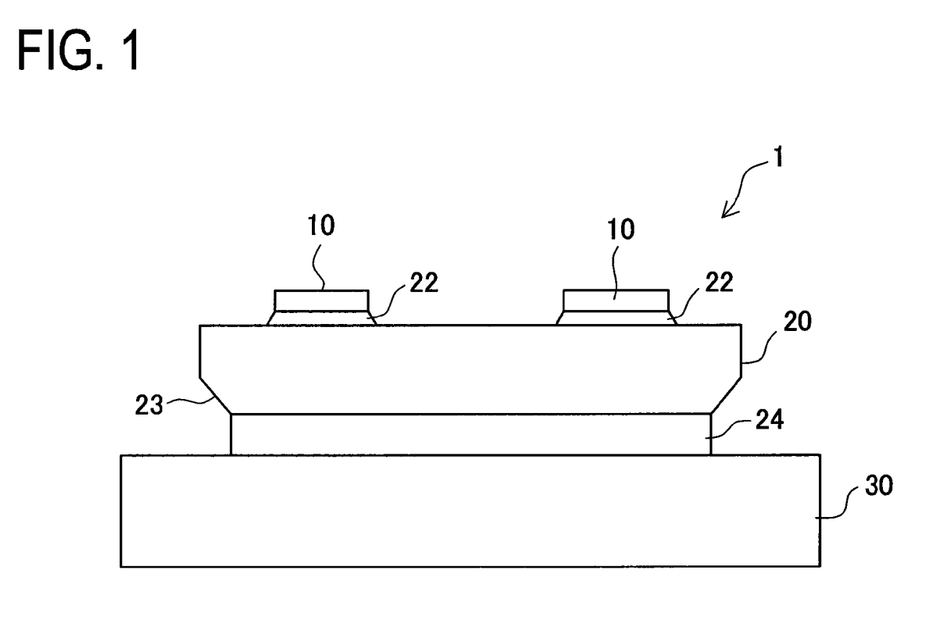
FIG. 1 a schematic side view of a power module manufactured by a bonding method in a first embodiment.

A first embodiment is first explained. A power module manufactured by use of the bonding method in the first embodiment is simply explained referring to FIG. 1. FIG. 1 is a schematic side view of the power module manufactured by the bonding method in the first embodiment.

As shown in FIG. 1, a power module 1 includes semiconductor elements 10 which are heating elements, a heat sink 20 on which the semiconductor elements 10 are mounted, and a cooler 30 internally containing flow channels 33 for coolant. In this power module 1, the heat from the semiconductor elements 10 is dissipated to the cooler 30 through the heat sink 20.

The semiconductor elements 10 are elements such as IGBT forming an inverter circuit. The semiconductor elements 10 are joined to the heat sink 20 with solder 22. Specifically, each semiconductor element 10 is soldered to the heat sink 20. It is to be noted that more semiconductor elements are installed an in-vehicle intelligent power module, but only a part thereof is schematically illustrated in FIG. 1 for facilitating explanation.

The heat sink 20 is made of a material with high heat conductivity (e.g., copper) to dissipate the heat from the semiconductor elements 10. Further, the heat sink 20 is bonded to the cooler 30 by a high heat conductive insulating resin sheet ("resin sheet") 24. Specifically, the heat sink 20 and the cooler 30 are integrated through the resin sheet 24. A surface of the heat sink 20 to be bonded to resin (i.e., a lower surface) is formed with a taper in a peripheral edge portion 23.

The high heat conductive insulating resin sheet 24 is made of for example a kind of composite material prepared by mixing epoxy resin with boron nitride fillers, alumina fillers, or aluminum nitride fillers, each having a precisely adjusted particle diameter. This material exhibits a good electric insulating property and also a higher heat conducting property than a known material made by mixing epoxy resin with silica fillers.

The cooler 30 includes cooling fins 31 and a cover plate 32 joined with leading ends of the cooling fins 31 (see FIG. 13). Components forming the cooler 30, such as the cooling fins 31, are made of materials such as aluminum alloy, having high heat conductivity and light weight. Hollows defined by the cooling fins 31 and the cover plate 32 in the cooler 30 serve as flow channels 33 for coolant. The coolant may be either liquid or gas.

Figure 2:
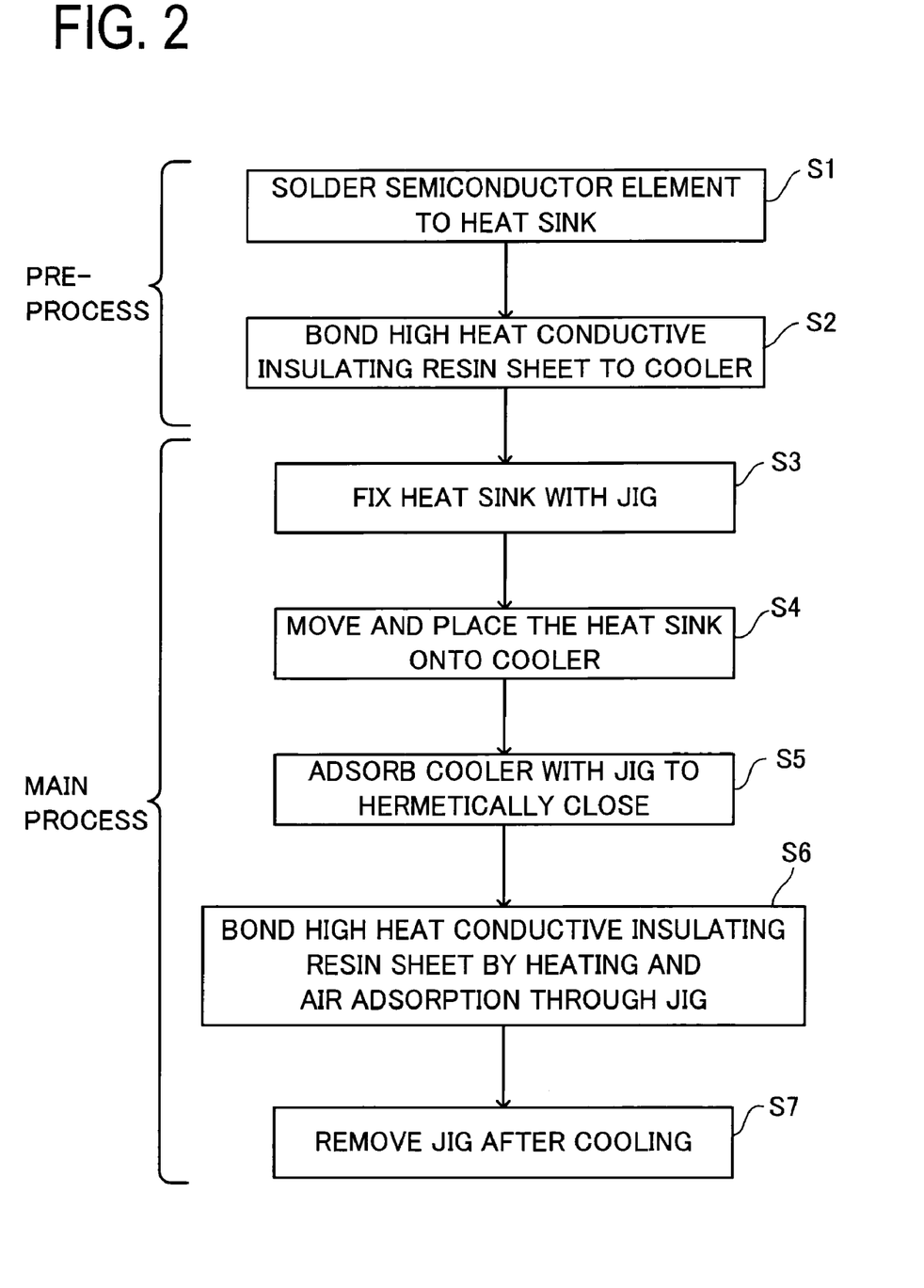
FIG. 2 is a flowchart showing the process of bonding high heat conductive insulating resin to a heat sink.
Figure 3:
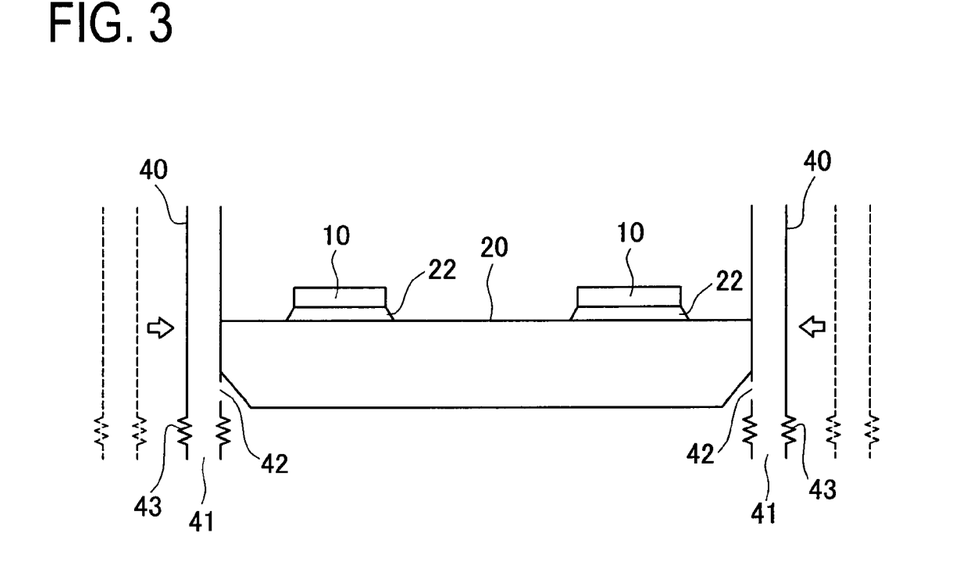
FIG. 3 is a schematic view showing how the heat sink is fixed with a jig.
Figure 4:
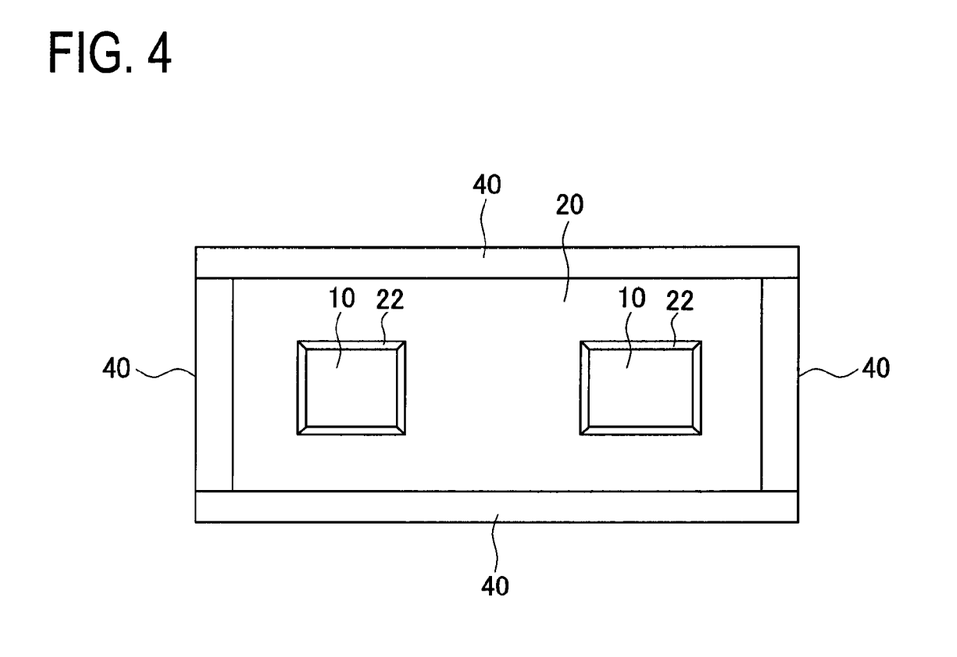
FIG. 4 is a schematic view showing a state where the heat sink is fixed with the jig.
Figure 5:
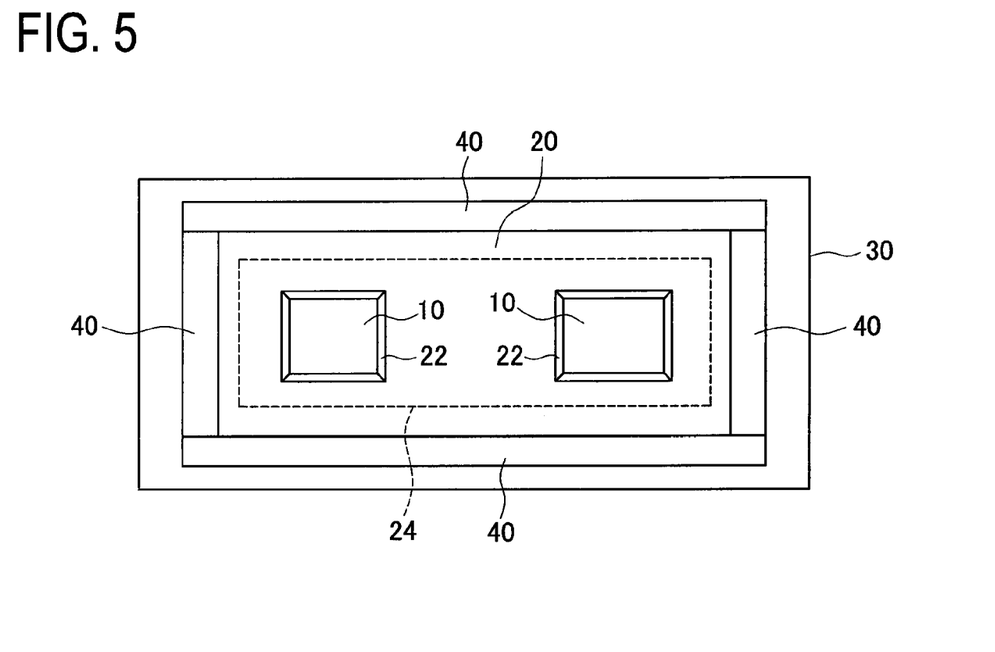
FIG. 5 is a schematic view showing a state where the heat sink fixed with the jig is placed on a cooler.
Figure 6:
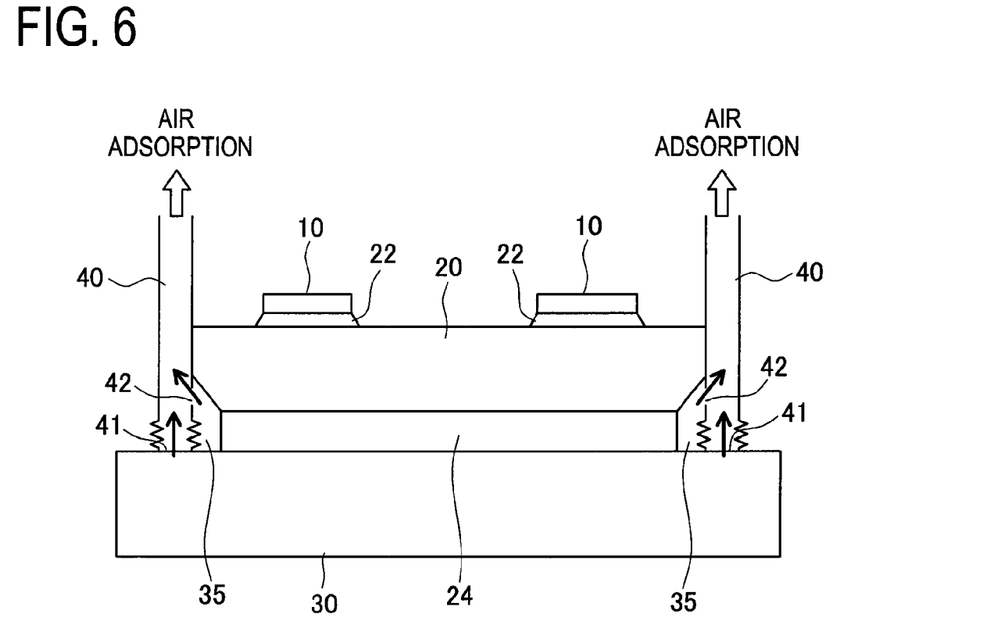
FIG. 6 is a schematic view showing a state where a high heat conductive insulating resin sheet is being bonded to the heat sink.

Next, a bonding method of high heat conductive insulating resin, which is applied to manufacture of the above power module 1, will be explained referring to FIGS. 2 to 6. FIG. 2 is a flowchart showing the process of bonding the high heat conductive insulating resin to the heat sink. FIG. 3 is a schematic view showing how the heat sink is fixed with a jig. FIG. 4 is a schematic view showing a state where the heat sink is fixed with the jig. FIG. 5 is a schematic view showing a state where the heat sink fixed with the jig is placed on the cooler. FIG. 6 is a schematic view showing a state where the high heat conductive insulating resin sheet is being bonded to the heat sink.

In the bonding method of high heat conductive insulating resin in the present embodiment, a pre-process (steps S1 and S2) is conducted prior to a main process (steps S3 to S7) of bonding the high heat conductive insulating resin to the heat sink. To be concrete, in the pre-process, the semiconductor elements 10 are soldered to the heat sink 20 (step S1) and the high heat conductive insulating resin sheet 24 is bonded to the cooler 30 (step S2). After completion of the pre-process, the main process is performed as will be mentioned later to bond the resin sheet 24 to the heat sink 20.

Specifically, in the main process, the heat sink 20 is first fixed by use of a jig (step S3). As shown in FIG. 3, concretely, a pair of hollow jigs 40 arranged opposite is moved close to the heat sink 20 and then the jigs 40 hold the heat sink 20 therebetween to fix the heat sink 20. The jigs 40 horizontally hold and fix the heat sink 20 by closely surrounding the heat sink 20 from short sides and long sides of the heat sink 20 as shown in FIG. 4.

One end of each jig 40 is connected to a vacuum pump not shown so that an opening 41 formed at the other end of each jig 40 performs air suction. Each jig 40 is formed with a hole 42 in an internal surface of a portion closer to the leading end (at the opening 41 side) than a portion holding the heat sink 20. Thus, each hole 42 allows air suction from a hermetically closed space 35 mentioned later (see FIG. 6) to be performed. Further, each jig 40 is provided with bellows 43 between the opening 41 and the hole 42. This bellows 43 is to position the jig 40 in a vertical direction (a Z direction).

After the heat sink 20 is horizontally held and fixed by the jigs 40, the heat sink 20 is moved and mounted on the cooler 30 (step S4) as shown in FIG. 5. Specifically, the heat sink 20 is placed so that its lower surface contacts with the resin sheet 24 bonded to the cooler 30 in step S2 and the openings 41 of the jigs 40 are put on the cooler 30 (see FIG. 6).

Successively, as shown in FIG. 6, the jigs 40 are caused to adsorb the cooler 30 through the openings 41, thereby creating the hermetically closed space 35 defined by the lower surface of the heat sink 20, the upper surface of the cooler 30, and the internal surfaces of the jigs 40 (step S5). Herein, the lower peripheral edge portion 23 is tapered, so that the lower surface of the heat sink 20, the upper surface of the cooler 30, and the internal surfaces of the jigs 40 can create the hermetically closed space 35 in as small a size as possible. This can achieve a downsized and simplified equipment.

The air is evacuated from the hermetically closed space 35 through the holes 42 of the jigs 40 to reduce the pressure in the hermetically closed space 35 and the resin sheet 24 is heated to bond to the heat sink 20 (step S6). Heating the resin sheet 24 may be performed in advance prior to placing the heat sink 20 or performed after placing the heat sink 20. For instance, for heating before placing the heat sink, a radiant heater or the like is be used. For heating after placing the heat sink 20, the cooler 30 is heated.

As above, the hermetically closed space 35 is reduced in pressure to generate a negative pressure around bonded portions of the heat sink 20 and the resin sheet 24. A pressure difference from the outside can make the heat sink 20 uniformly bond to the resin sheet 24 in a close contact manner. Further, in bonding, the heat sink 20 is not pressed from above (the semiconductor element 10 side). These make it possible to reliably prevent the occurrence of stress concentration on the resin sheet 24 during bonding. Thus, the resin sheet 24 is less likely to be broken. Consequently, the insulating performance of the resin sheet 24 does not decrease.

Since the heat sink 20 and the resin sheet 24 are bonded under a reduced pressure, voids are less likely to occur in the bonded surface of the resin sheet 24. Even if voids occur, such voids are smaller than conventional ones. Accordingly, the heat conducting performance of the resin sheet 24 does not decrease. In other words, heat conduction from the heat sink 20 to the cooler 30 is not cut off by the bonded portion of the resin sheet 24. The semiconductor elements 10 can therefore be cooled efficiently.

Thereafter, the entire is cooled and air adsorption of the jigs 40 are stopped, releasing the fixing of the heat sink 20 exercised by the jigs 40, and then the jigs 40 are removed (step S7). Thus, the power module 1 shown in FIG. 1 is completed in which the heat sink 20 and the resin sheet 24 are bonded to each other.

According to the bonding method in the first embodiment as explained in detail above, the hermetically closed space 35 is locally created. While this space 35 is reduced in pressure, the heat sink 20 and the resin sheet 24 are bonded to each other. It is consequently possible to uniformly bond the resin sheet 24 without breakage and also prevent the generation of voids. As a result, the resin sheet 24 can be bonded to the heat sink 20 without deteriorating the insulating performance and the heat conducting performance of the resin sheet 24.

Second Embodiment

A second embodiment will be explained below. The second embodiment is similar to the first embodiment that the hermetically closed space 35 is reduced in pressure to bond the heat sink and the high heat conductive insulating resin sheet, excepting that air is evacuated through different portions to reduce the pressure in the hermetically closed space 35 from in the first embodiment. Accordingly, the second embodiment is slightly different from the first embodiment in the configurations of a jig, a heat sink, and a high heat conductive insulating resin sheet. The following explanation is therefore given with a focus on the differences from the first embodiment.

Figure 7:
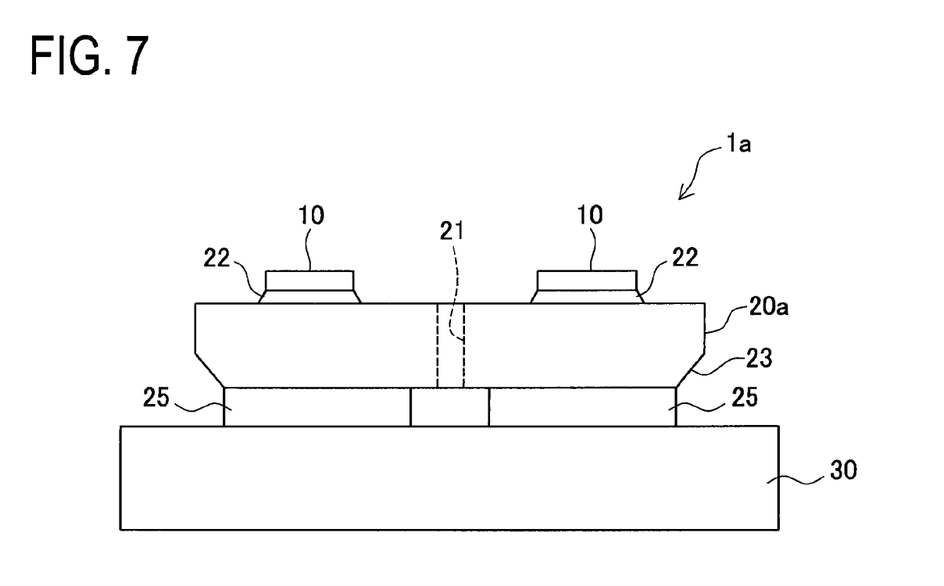
FIG. 7 is a schematic side view of a power module manufactured by a bonding method in a second embodiment.

Firstly, a power module manufactured by a bonding method in the second embodiment is briefly explained referring to FIG. 7. FIG. 7 is a schematic side view of the power module manufactured by the bonding method in the second embodiment.

As shown in FIG. 7, a power module 1a includes semiconductor elements 10 which are heating elements, a heat sink 20a on which the semiconductor elements 10 are mounted, and a cooler 30 internally provided with flow channels 33. The configurations of the semiconductor elements 10 and the cooler 30 are identical to those in the first embodiment and the configuration of the heat sink 20a is slightly different from that in the first embodiment. Specifically, the heat sink 20a is formed with a through hole 21. This through hole 21 is located on or near the center of the heat sink 20a on which the semiconductor elements 10 are not mounted (see FIG. 8).

This heat sink 20a is integrated with the cooler 30 through a plurality of high heat conductive insulating resin sheets ("resin sheets") 25. In this embodiment, two separate resin sheets 25 are used. These resin sheets 25 are located around the through hole 21 to allow air to be evacuated from the hermetically closed space 35 through the through hole 21 (see FIG. 8).

Figure 8:
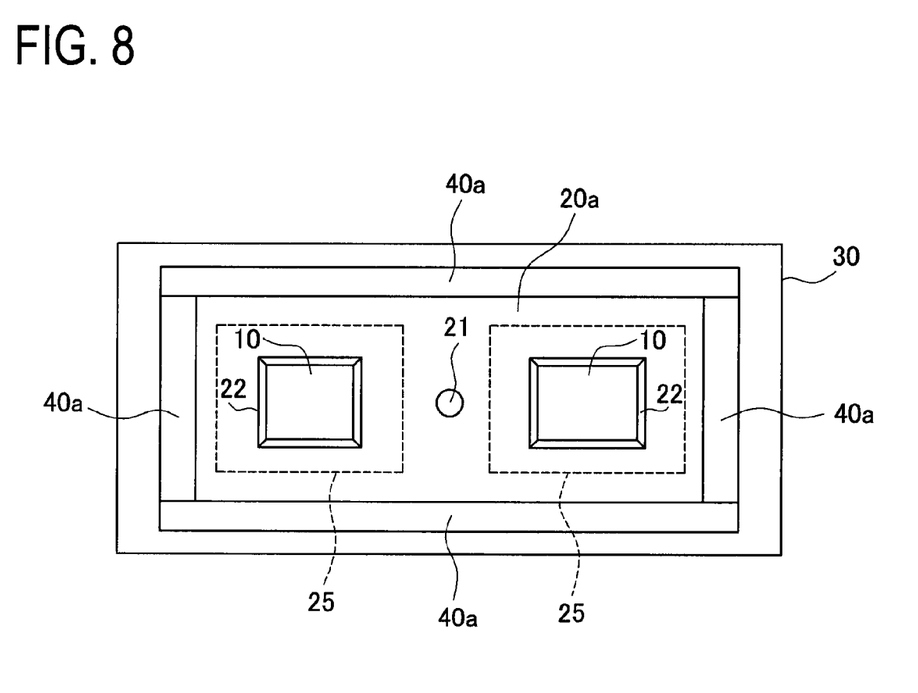
FIG. 8 is a schematic view showing a state where a heat sink fixed with a jig is placed on a cooler.
Figure 9:
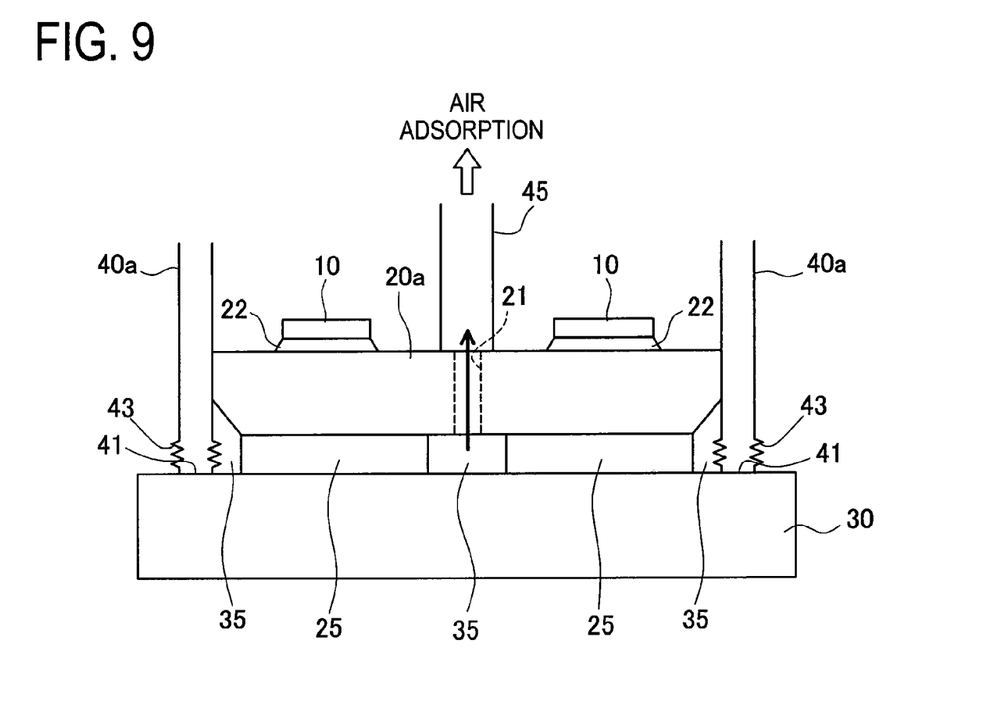
FIG. 9 is a schematic view showing a state where separate high heat conductive insulating resin sheets are being bonded to a heat sink.

Secondly, the bonding method of high heat conductive insulating resin, which is applied to manufacture of the aforementioned power module 1a, is explained referring to FIGS. 8 and 9. FIG. 8 is a schematic view showing a state where a heat sink fixed with jigs is placed on a cooler. FIG. 9 is a schematic view showing a state where the separate resin sheets are being bonded to the heat sink.

In the bonding method of high heat conductive insulating resin in the present embodiment, similar to the first embodiment, a main process is conducted after a pre-process is performed. In the main process, as shown in FIG. 8, jigs 40a horizontally hold and fix the heat sink 20a by closely surrounding the heat sink 20a from short sides and long sides of the heat sink 20a. The heat sink 20a is placed so that its lower surface contacts with the separate resin sheets 25 previously bonded to the cooler 30 and the openings 41 of the jigs 40 are put on the cooler 30. It is to be noted that the jigs 40a are not formed with the holes 42.

As shown in FIG. 9, the jigs 40a adsorb the cooler 30 through the openings 41, thereby creating a hermetically closed space 35 defined by the lower surface of the heat sink 20a, the upper surface of the cooler 30, and the internal surfaces of the jigs 40a. An adsorbing jig 45 is disposed on the heat sink 20a so as to cover over the through hole 21. The adsorbing jig 45 adsorbs the heat sink 20a and evacuates air from the hermetically closed space 35 through the through hole 21, thereby reducing the pressure in the hermetically closed space 35. Simultaneously, the separates resin sheets 25 are heated to bond to the heat sink 20a.

As above, the internal pressure of the hermetically closed space 35 is reduced by evacuation of air from near the center of the hermetically closed space 35. It is therefore possible to uniformly bond the heat sink 20a and the separate resin sheets 25 in closer contact manner. In bonding, the heat sink 20a is not pressed from above (the semiconductor element 10 side). These can reliably prevent the occurrence of stress concentration on the separate resin sheets 25 during bonding. Thus, the separate resin sheets 25 are less likely to be broken. Consequently, the insulating performance of the separate resin sheets 25 does not decrease.

Since the heat sink 20a and the separate resin sheets 25 are bonded under a reduced pressure, voids are less likely to occur in the bonded surface of each resin sheet 25. Even if voids occur, such voids are smaller than conventional ones. Accordingly, the heat conducting performance of the separate resin sheets 25 does not decrease. In other words, heat conduction from the heat sink 20a to the cooler 30 is not cut off by a bonded portion of each resin sheet 25. The semiconductor elements 10 can therefore be cooled efficiently.

Thereafter, the entire is cooled and then the jigs 40a and 45 are removed. Thus, the power module 1a shown in FIG. 7 is completed in which the heat sink 20a and the separate resin sheets 25 are bonded to each other.

According to the bonding method in the second embodiment as explained in detail above, the hermetically closed space 35 is locally created. While this space 35 is reduced in pressure, the heat sink 20a and the separate resin sheets 25 are bonded to each other. It is consequently possible to uniformly bond each resin sheet 25 without breakage and also prevent the generation of voids. As a result, the separates resin sheets 25 can be bonded to the heat sink 20a without deteriorating the insulating performance and the heat conducting performance of the separate resin sheets 25.

When the pressure reduction of the hermetically closed space 35 is performed by use of the adsorbing jig 45 through the through hole 21, air is evacuated from near the center of the hermetically closed space 35. Thus, the heat sink 20a and the separate resin sheets 25 can be more uniformly bonded to each other. Furthermore, the use of the separate resin sheets 25 can improve contact strength between the heat sink 20a and the resin sheets 25. These makes possible to uniformly bond the separate resin sheets 25 to the heat sink 20a without breakage of the sheets 25 and also prevent the occurrence of voids.

Third Embodiment

A third embodiment is explained below. The third embodiment, different from the first and second embodiments, uses a liquid high heat conductive insulating resin to bond the high heat conductive insulating resin to a heat sink. Accordingly, the third embodiment is slightly different in the configuration of a jig from the first and second embodiments. The following explanation is thus given with a focus on the differences from the first and second embodiments.

Figure 10:
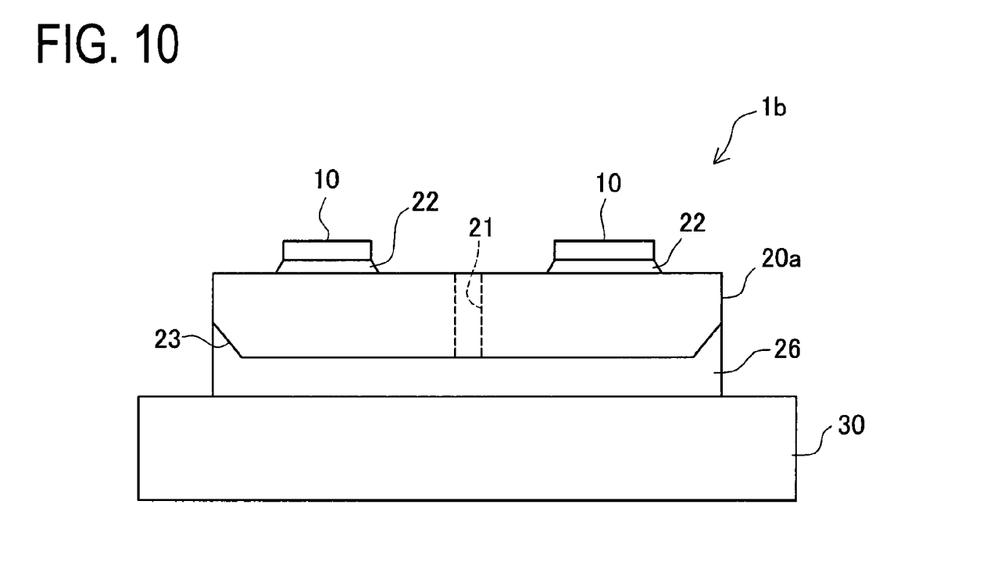
FIG. 10 is a schematic side view of a power module manufactured by a bonding method in a third embodiment.

Firstly, a power module manufactured by the bonding method in the third embodiment is briefly explained referring to FIG. 10. FIG. 10 is a schematic side view of the power module manufactured by the bonding method in the third embodiment.

As shown in FIG. 10, a power module 1b includes semiconductor elements 10 which are heating elements, a heat sink 20a on which the semiconductor elements 10 are mounted, and a cooler 30 internally provided with coolant flow channels 33. The configuration of the semiconductor elements 10 and the cooler 30 are identical to those in the first embodiment and the configuration of the heat sink 20a is identical to that in the second embodiment.

The heat sink 20a is integrated with the cooler 30 through a high heat conductive insulating resin 26. This high heat conductive insulating resin 26 is not a resin sheet, but is made in a manner that a liquid high heat conductive insulating resin is injected into the hermetically closed space 35 and hardened therein.

Figure 11:
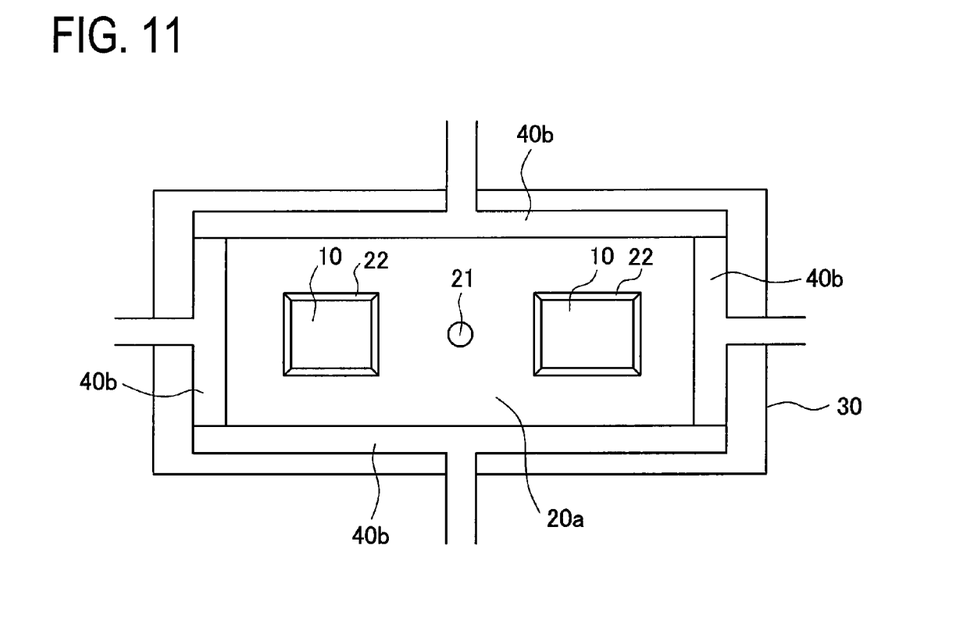
FIG. 11 is a schematic view showing a state where a heat sink fixed with a jig is placed on a cooler.
Figure 12:
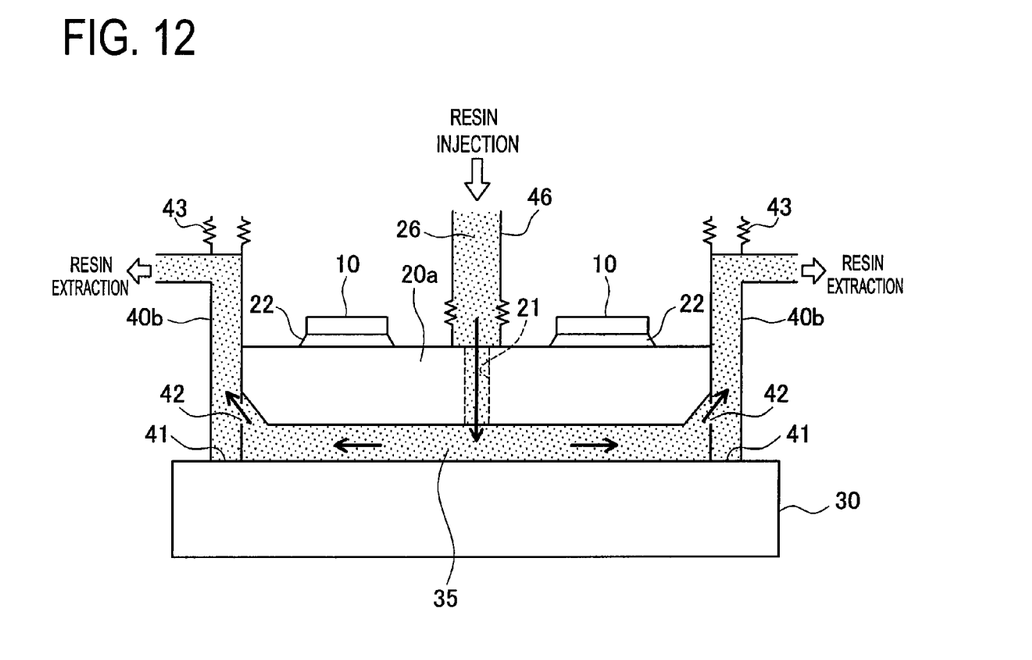
FIG. 12 is a schematic view showing a bonding state of the high heat conductive insulating resin to a heat sink and a cooler.

Secondly, the bonding method of high heat conductive insulating resin, which is applied to manufacture of the aforementioned power module 1b, is explained referring to FIGS. 11 and 12. FIG. 11 is a schematic view showing a state where a heat sink fixed with jigs is placed on a cooler. FIG. 12 is a schematic view showing a state where the high heat conductive insulating resin is being bonded to the heat sink and the cooler.

Even in the bonding method of high heat conductive insulating resin in the present embodiment, as with the first and second embodiments, a main process is conducted after a pre-process is performed. In the pre-process, however, a step of previously bonding the high heat conductive insulating resin to the cooler (step S2) is omitted.

In the main process, as shown in FIG. 11, jigs 40b horizontally hold and fix the heat sink 20a by closely surrounding the heat sink 20a from short sides and long sides of the heat sink 20a. The jigs 40b fixedly holding the heat sink 20a are placed so that openings 41 contact with the cooler 30. The heat sink 20a is thus positioned at a predetermined distance apart from the cooler 30 (see FIG. 12). It is to be noted that each jig 40b is provided with bellows 43 in an upper portion.

Thereafter, as shown in FIG. 12, the jigs 40b adsorb the cooler 30 through the openings 41, thereby creating a hermetically closed space 35 defined by the lower surface of the heat sink 20a, the upper surface of the cooler 30, and the internal surfaces of the jigs 40b. An injection jig 46 is then put on the heat sink 20a so as to cover over a through hole 21. A liquid high heat conductive insulating resin 26 is injected by the injection jig 46 into the hermetically closed space 35 through the through hole 21. Thus, the resin 26 injected in the hermetically closed space 35 is sucked and extracted outside through holes 42 of the jigs 40b. By this injection and extraction of the high heat conductive insulating resin 26 with respect to the hermetically closed space 35, the liquid high heat conductive insulating resin 26 is filled in the hermetically closed space 35 and then the hardened high heat conductive insulating resin 26 is bonded to the heat sink 20a and the cooler 30.

As above, while the liquid high heat conductive insulating resin 26 is being injected into the hermetically closed space 35 from near the center thereof through the through hole 21, the injected resin 26 is sucked and extracted from the periphery of the hermetically closed space 35 through the holes 42 of the jigs 40b, thereby filling the resin 26 into the hermetically closed space 35. Accordingly, the liquid resin 26 is caused to uniformly flow in the hermetically closed space 35. This can reliably prevent the occurrence of voids. Thus, the heat conducting property of the high heat conductive insulating resin 26 does not decrease.

Furthermore, the liquid high heat conductive insulating resin 26 is filled in the hermetically closed space 35 and hardened therein so that the resin 26 is bonded to the heat sink 20a and the cooler 30. The resin 26 is therefore not broken. The insulating performance of the high heat conductive insulating resin 26 does not decrease accordingly.

Consequently, the high heat conductive insulating resin 26 can be bonded to the heat sink 20a and the cooler 30 without deteriorating the insulating performance and the heat conducting property of the resin 26. According to this bonding method, the resin 26 is bonded to both the heat sink 20a and the cooler 30 at the same time. Therefore, there is no need to bond the high heat conductive insulating resin to the cooler 30 in advance as in the first and second embodiments.

Thereafter, the entire is cooled and the jigs 40b and 46 are removed. As above, the power module 1b shown in FIG. 10 is completed in which the high heat conductive insulating resin 26 is bonded to the heat sink 20a and the cooler 30.

According to the bonding method in the third embodiment as explained in detail above, the hermetically closed space 35 is locally created. While the liquid high heat conductive insulating resin 26 is injected into the hermetically closed space 35, a part of the resin 26 is sucked and extracted, thereby filling the high heat conductive insulating resin 26 into the hermetically closed space 35. The hardened high heat conductive insulating resin 26 is thus bonded to the heat sink 20a and the cooler 30. It is therefore possible to uniformly bond the high heat conductive insulating resin 26 without breakage and also prevent the occurrence of voids in the resin 26. Consequently, the resin 26 can be bonded to the heat sink 20a and the cooler 30 without deteriorating the insulating performance and the heat conducting property of the resin 26.

The above embodiments are mere examples and do not give any limitations to the present invention. The present invention may be embodied in other specific forms without departing from the essential characteristics thereof. For instance, in the aforementioned embodiments, the high heat conductive insulating resin is bonded to the heat sink having the lower surface with a tapered peripheral edge portion. As a matter of course, the high heat conductive insulating resin can be bonded well to even a heat sink having a lower surface with no tapered peripheral edge portion.

In the aforementioned second embodiment, air is evacuated from the hermetically closed space 35 through only the through hole 21. As an alternative, the jigs 40a may be formed with holes 42 (i.e., the jigs 40 are used instead of the jigs 40a) to additionally evacuate air from the periphery of the hermetically closed space 35.

REFERENCE SIGNS LIST

1 Power module
10 Semiconductor element
20 Heat sink
21 Through hole
22 Solder
23 Peripheral portion
24 High heat conductive insulating resin sheet
25 Separate high heat conductive insulating resin sheet
26 High heat conductive insulating resin
30 Cooler
35 Hermetically closed space
40 Jig
41 Opening
42 Hole
45 Adsorbing jig
46 Injection jig

The invention claimed is:

1. A method of bonding a high heat conductive insulating resin to a heat sink on which a semiconductor element is soldered so that the high heat conductive insulating resin is interposed between a heat sink and a cooler, the heat sink being to be provided in a power module, the method comprising:

a fixing step of fixing the heat sink with a hollow jig;
a placing step of placing the heat sink fixed with the hollow jig onto a sheet-like high heat conductive insulating resin bonded to the cooler in advance, to create a hermetically closed space; and
a bonding step of reducing pressure in the hermetically closed space to create a negative pressure around bonded portions of the heat sink and the sheet-like high heat conductive insulating resin and heating the sheet-like high heat conductive insulating resin to bond the sheet-like high heat conductive insulating resin to the heat sink, wherein
the fixing step includes horizontally fixing the heat sink with the hollow jig to hold the heat sink between internal surfaces of the hollow jig,
the placing step includes making the hollow jig adsorb the cooler through an opening formed in an end of the hollow jig to create the hermetically closed space defined by the heat sink, the cooler, and the hollow jig, and
the bonding step includes evacuating air from the hermetically closed space through a hole formed in the internal surfaces of the hollow jig to create a negative pressure around the bonded portions.

2. The method of bonding high heat conductive insulating resin according to claim 1, wherein a surface of the heat sink to be bonded to the resin is formed with a taper in a peripheral edge portion.

* * * * *